(12) United States Patent
Wang et al.

(10) Patent No.: US 9,093,317 B2
(45) Date of Patent: Jul. 28, 2015

(54) SEMICONDUCTOR DEVICE AND FABRICATION METHOD

(71) Applicants: Semiconductor Manufacturing International (Beijing) Corporation, Beijing (CN); Semiconductor Manufacturing International (Shanghai) Corporation, Shanghai (CN)

(72) Inventors: Xinpeng Wang, Shanghai (CN); Jing Pan, Shanghai (CN); Qi Wang, Shanghai (CN); Xianjie Ning, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/229,916

(22) Filed: Mar. 30, 2014

(65) Prior Publication Data
US 2015/0054051 A1 Feb. 26, 2015

(51) Int. Cl.
*H01L 27/115* (2006.01)
*H01L 29/788* (2006.01)
*H01L 29/66* (2006.01)
*H01L 21/28* (2006.01)

(52) U.S. Cl.
CPC .... *H01L 27/11531* (2013.01); *H01L 21/28273* (2013.01); *H01L 29/66825* (2013.01); *H01L 29/788* (2013.01)

(58) Field of Classification Search
None
See application file for complete search history.

(56) References Cited

U.S. PATENT DOCUMENTS

| | | | | |
|---|---|---|---|---|
| 4,598,460 | A * | 7/1986 | Owens et al. | 438/201 |
| 5,223,451 | A * | 6/1993 | Uemura et al. | 438/201 |
| 5,445,980 | A * | 8/1995 | Komori et al. | 438/258 |
| 5,466,622 | A * | 11/1995 | Cappelletti | 438/258 |
| 5,911,105 | A * | 6/1999 | Sasaki | 438/258 |
| 5,913,120 | A * | 6/1999 | Cappelletti | 438/257 |
| 6,037,222 | A * | 3/2000 | Huang et al. | 438/257 |
| 6,180,457 | B1 * | 1/2001 | Shin et al. | 438/258 |
| 6,287,907 | B1 * | 9/2001 | Ito et al. | 438/201 |
| 6,344,386 | B1 * | 2/2002 | Io | 438/238 |
| 6,417,044 | B1 * | 7/2002 | Ono | 438/241 |
| 6,753,222 | B2 * | 6/2004 | Mimuro et al. | 438/257 |
| 7,045,413 | B2 * | 5/2006 | Lee et al. | 438/230 |
| 7,964,288 | B2 * | 6/2011 | Nakagawa et al. | 428/594 |
| 8,304,310 | B2 * | 11/2012 | Hashimoto et al. | 438/257 |
| 2003/0022445 | A1 * | 1/2003 | Taniguchi et al. | 438/257 |
| 2005/0224864 | A1 * | 10/2005 | Hashimoto et al. | 257/315 |

* cited by examiner

*Primary Examiner* — Andres Munoz
(74) *Attorney, Agent, or Firm* — Anova Law Group, PLLC

(57) ABSTRACT

Semiconductor devices and fabrication methods are provided. A semiconductor substrate includes a first region and a second region. A gate dielectric material layer is formed to cover the first region, and a control gate dielectric layer is formed over a surface portion of the second region. The control gate dielectric layer has a top surface higher than the gate dielectric layer. A gate material layer is conformally formed to cover an entire surface of the semiconductor substrate and has a top surface in the second region higher than a top surface in the first region. A first filling material layer is formed on the gate material layer. A first patterned mask layer is formed on the first filling material layer to form a gate on a gate dielectric layer in the first region. A control gate is formed on the control gate dielectric layer of the second region.

15 Claims, 8 Drawing Sheets

SEMICONDUCTOR DEVICE AND FABRICATION METHOD

CROSS-REFERENCES TO RELATED APPLICATIONS

This application claims the priority to Chinese Patent Application No. 201310657174.0, filed on Dec. 6, 2013, which is incorporated herein by reference in its entirety.

FIELD OF THE DISCLOSURE

The present disclosure generally relates to the field of semiconductor technology and, more particularly, relates to semiconductor devices including an embedded flash memory device and methods for fabricating the semiconductor devices.

BACKGROUND

In current semiconductor industry, integrated circuit (IC) products can include: logic, memory, and analog circuits. Memory devices take a considerable proportion in IC products. In recent years, flash memories have been rapidly developed. Flash memories can long-termly maintain stored information without supplying power. Flash memories have advantages including high integration degree, fast access speed, and ease for erasing and rewriting. Flash memories are thus widely used in the field of computer, automation control, etc.

With development of semiconductor technology and with more extensive applications of memory devices, the memory devices have to be formed with other suitable devices on a same chip to form embedded semiconductor memory device. For example, when the memory device is embedded in a central processor, the memory device is required to be compatible with the central processor platform and is also required to maintain original specifications and electrical properties.

Generally, the memory device needs to be compatible with an embedded, standard logic device. An embedded flash memory device often includes a logic region and a storage region. The logic region often includes high voltage transistors and low voltage transistors. The storage region often includes a storage unit including a floating gate on a semiconductor substrate surface and a control gate structure on top of the floating gate.

However, it is still desirable to improve properties of the storage unit in the storage region of conventional embedded flash memory devices.

BRIEF SUMMARY OF THE DISCLOSURE

One aspect of the present disclosure includes a method for forming a semiconductor device by providing a semiconductor substrate including a first region and a second region. A gate dielectric material layer is formed to cover the first region of the semiconductor substrate. A floating gate dielectric layer is formed on a surface portion of the second region of the semiconductor substrate. A floating gate is formed on the floating gate dielectric layer. A control gate dielectric layer is formed on the floating gate. The control gate dielectric layer has a top surface higher than the gate dielectric layer on the first region.

A gate material layer is conformally formed to cover the gate dielectric material layer of the first region and to cover the semiconductor substrate, sidewalls of the floating gate dielectric layer and the floating gate and the control gate dielectric layer, the control gate dielectric layer of the second region. The gate material layer on the control gate dielectric layer of the second region has a top surface higher than a top surface over the first region. A first filling material layer is formed on the gate material layer to provide a first flat surface. A first patterned mask layer is formed on the first filling material layer to cover the second region and to pattern the first region. A gate on a gate dielectric layer is formed in the first region by etching the gate material layer and the gate dielectric layer using the first patterned mask layer as an etch mask. The gate material layer on the second region has the top surface higher than a top surface of the gate of the first region. A control gate is formed on the control gate dielectric layer of the second region by etching the gate material layer on the second region.

Another aspect of the present disclosure includes a semiconductor device. The semiconductor device includes a semiconductor substrate including a first region and a second region. A gate on a gate dielectric layer is disposed on the first region of the semiconductor substrate. A control gate is disposed on a control gate dielectric layer that is disposed on a floating gate, the floating gate disposed on a floating gate dielectric layer on the second region of the semiconductor substrate. The gate and the control gate are formed by forming a gate dielectric material layer to cover the first region of the semiconductor substrate, and forming the floating gate dielectric layer on a surface portion of the second region of the semiconductor substrate, the floating gate on the floating gate dielectric layer, and the control gate dielectric layer on the floating gate, wherein the control gate dielectric layer has a top surface higher than the gate dielectric layer on the first region. A gate material layer is conformally formed to cover the gate dielectric material layer of the first region and to cover the semiconductor substrate, sidewalls of the floating gate dielectric layer and the floating gate and the control gate dielectric layer, the control gate dielectric layer of the second region. The gate material layer on the control gate dielectric layer of the second region has a top surface higher than a top surface over the first region. A first filling material layer is formed on the gate material layer to provide a first flat surface. A first patterned mask layer is formed on the first filling material layer to cover the second region and to pattern the first region. A gate on a gate dielectric layer is formed in the first region by etching the gate material layer and the gate dielectric layer using the first patterned mask layer as an etch mask. The gate material layer on the second region has the top surface higher than a top surface of the gate of the first region. A control gate is formed on the control gate dielectric layer of the second region by etching the gate material layer of the second region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Conventional method of forming an embedded flash memory device may cause damages to a top surface of the control gate in the storage unit. This affects performance of the storage unit. To improve properties of the storage unit in the storage region of embedded flash memory devices, disclosed herein provides semiconductor devices such as embedded flash memory devices and methods for forming the semiconductor devices such as the embedded flash memory devices.

FIGS. 1-5 depict a conventional method for forming an embedded flash memory device.

Figure 1:
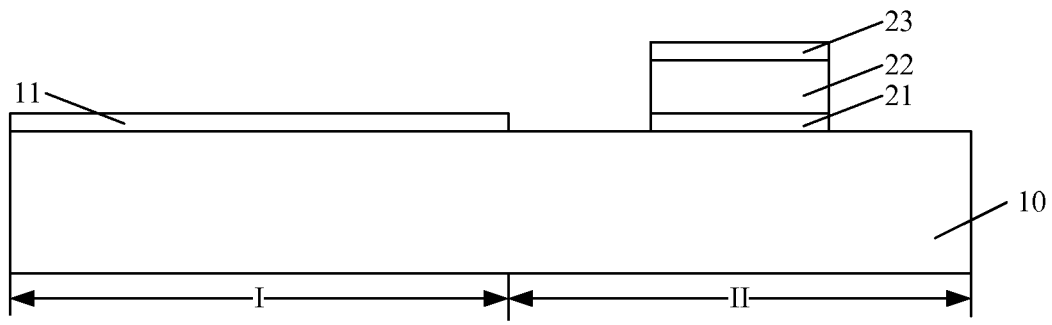
FIGS. 1-5 depict a conventional method for forming an embedded flash memory device.

In FIG. 1, a semiconductor substrate 10 is provided having a first region I and a second region II. The first region is a logic region, and the second region II is a storage region. An isolation structure (not shown) is formed between the first region I and the second region II. A gate dielectric layer 11 is formed on the first region I. A floating gate dielectric layer 21 is formed on the second region II. A floating gate 22 is formed on surface of the floating gate dielectric layer 21. A control gate dielectric layer 23 is formed on surface of the floating gate 22.

Figure 2:
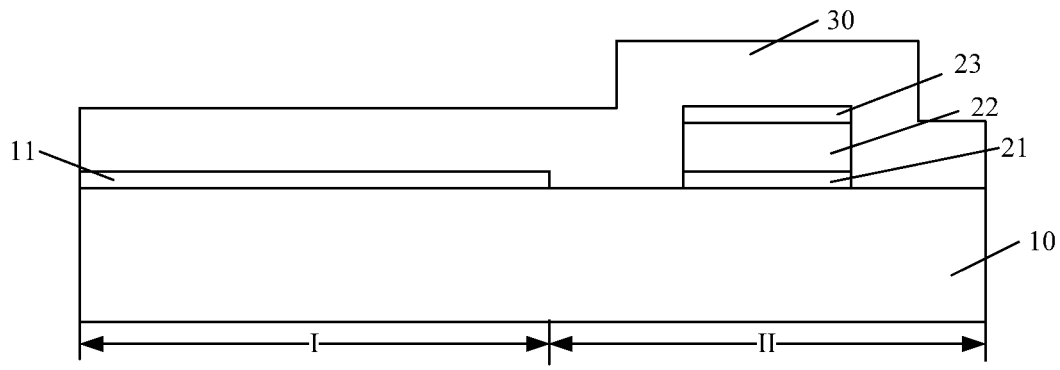

In FIG. 2, a polysilicon layer 30 is formed to cover surface of the semiconductor substrate 10, the gate dielectric layer 11, the floating gate dielectric layer 21, the floating gate 22, and the control gate dielectric layer 23.

Figure 3:
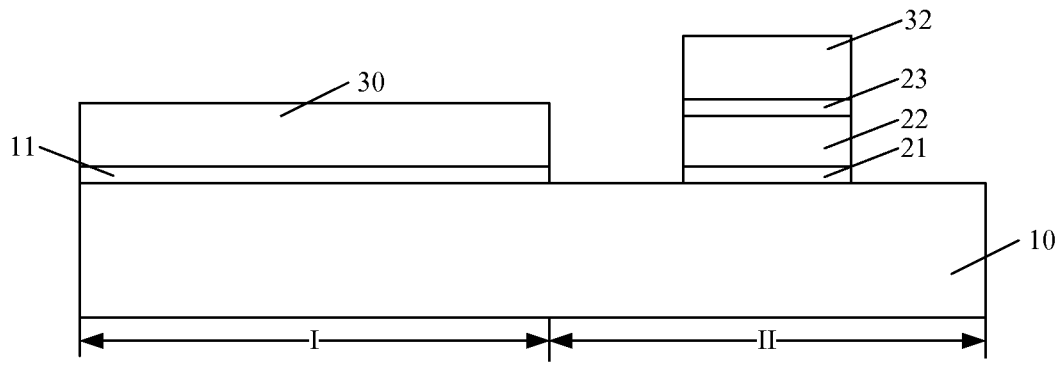

In FIG. 3, the polysilicon layer 30 in the second region II is etched to form a control gate 32. The control gate 32 has a top surface higher than a top surface of the polysilicon layer 30 in the first region I.

Figure 4:
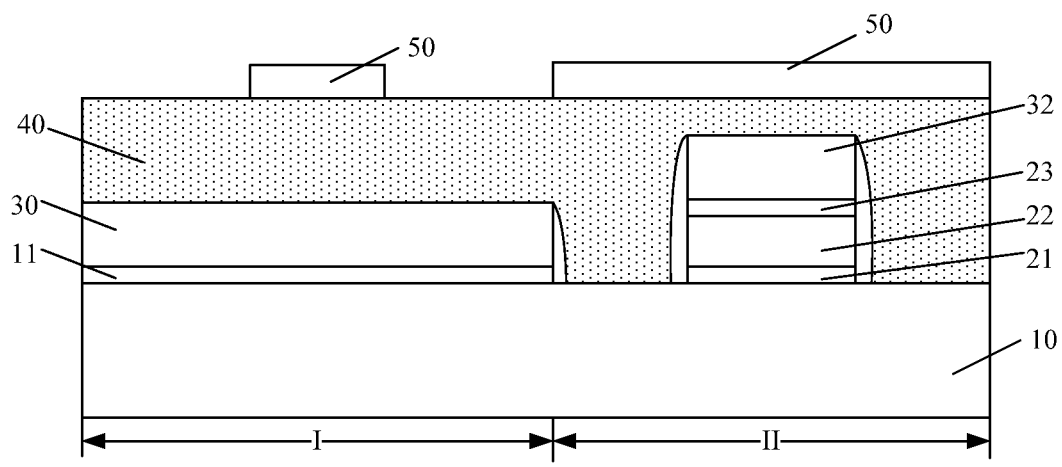

In FIG. 4, sidewall spacers are formed on both sidewalls of each of the floating gate dielectric layer 21, the floating gate 22, the control gate dielectric layer 23, and the control gate 32. A bottom anti-reflection layer (BARC) 40 is formed on surfaces of the semiconductor substrate 10, the polysilicon layer 30, and the control gate 32. A patterned photoresist layer 50 is formed on the bottom anti-reflection layer 40.

Figure 5:
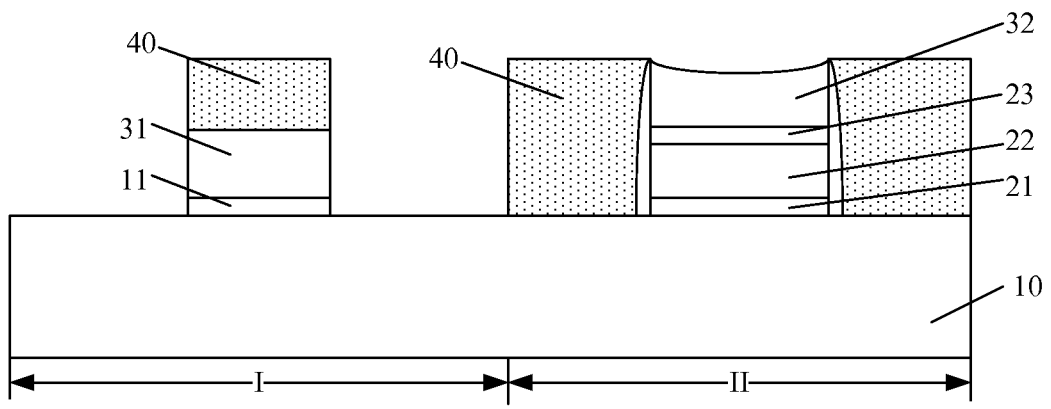

In FIG. 5, the patterned photoresist layer 50 is used as a mask to etch the bottom anti-reflection layer 40, the polysilicon layer 30, and the gate dielectric layer 11 to form a gate dielectric layer 11 and a gate electrode 31 on the gate dielectric layer 11.

Since the storage unit of the second region II has an operating voltage greater than an operating voltage of the transistor of the first region I, a total thickness of the sidewall spacer on both sidewalls of the control gate and the floating gate of the storage unit of the second region II should be greater than the total thickness of the gate sidewall spacer on both sidewalls of the transistor of the first region I. A distance between the source/drain region and the control gate of the storage unit can be increased to avoid breakdown between the source/drain region and the control gate. Otherwise, performance of the storage unit may be adversely affected.

Therefore, conventionally, the control gate is firstly formed on the second region II, and then sidewall spacers are formed on sidewalls of the control gate and the floating gate. This is followed by forming a gate over the first region I, and simultaneously forming an outer spacer on sidewalls of the gate on the first region I and on the spacer formed on the second region II. This can allow a total thickness of sidewall spacers on the second region II is greater than a total thickness of sidewall spacers on the first region I and thus to save process steps.

However, the surface of conventionally formed control gate of the storage unit often has defects. Note that because of the floating gate 22 (as shown in FIG. 4), a surface height difference exists between surfaces of the control gate 32 in the second region II and the polysilicon layer 30 in the first region I. This causes the total thickness of the photoresist layer and BARC on the control gate 32 over the second region II is less than the total thickness of the photoresist layer and BARC on the surface of the polysilicon layer 30 over the first region I. After the control gate is formed in the second region II, recesses/grooves may be formed between adjacent storage units on the second region II. While forming the BARC using a spin-coating process, a large amount of the BARC material may fill in the recesses/grooves. This may cause less final total thickness of the BARC on the control gate over the second region II (vs. the first region I). As a result, when etching to form the gate dielectric layer 30 and the polysilicon layer 10 in the first region I, the BARC 40 and the photoresist layer 50 do not have a sufficient thickness to protect the control gate 32 over the second region II. The control gate 32 can thus have a damaged surface, which affects performances of the storage units of the second region.

When more BARC material is used to increase the total thickness of the BARC 40 and the photoresist layer 50 in the second region II, photolithography resolution can be reduced, leading to non-accurate gate size of the transistor in the first region I. Multilayer photoresist mask may be used in the photolithography process to increase the thickness the photoresist layer 50. This, however, may reduce the resolution of the photolithography and increase manufacturing cost with complicated process.

Disclosed herein provide a semiconductor device and a method of forming the semiconductor device. The semiconductor device may include an embedded flash memory device. The semiconductor device may include a logic region and a storage region. For example, a gate of a transistor in the logic region can be formed first, followed by forming a control gate of a storage unit in the storage region. As such, damages to the control gate can be avoided and performance of storage units can be improved.

Figure 19:
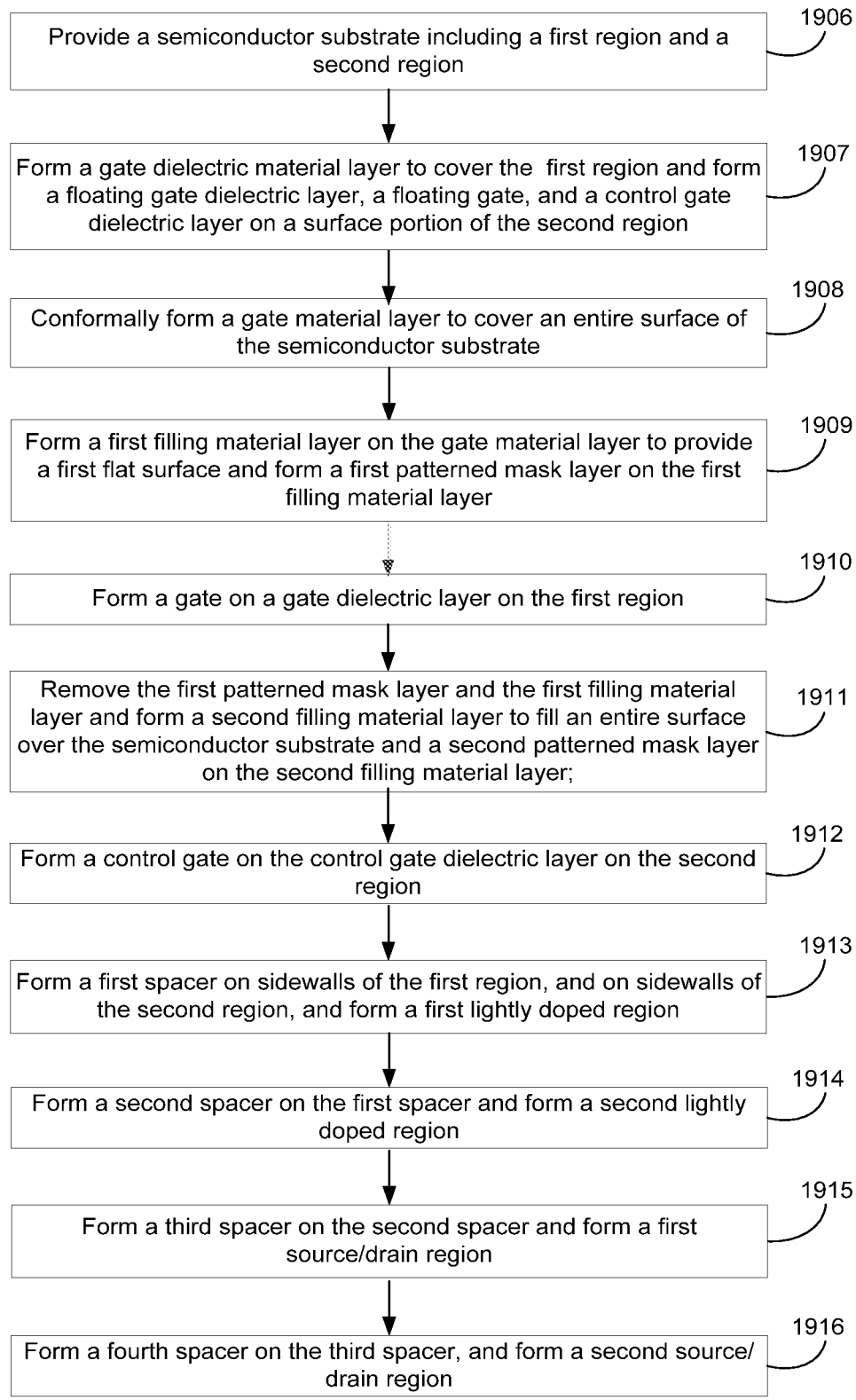
FIG. 19 depicts an exemplary method for forming a semiconductor device consistent with various disclosed embodiments.

FIGS. 6-16 depict an exemplary semiconductor device at various stages during formation, and FIG. 19 depicts an exemplary method for forming a semiconductor device consistent with various disclosed embodiments.

Figure 6:
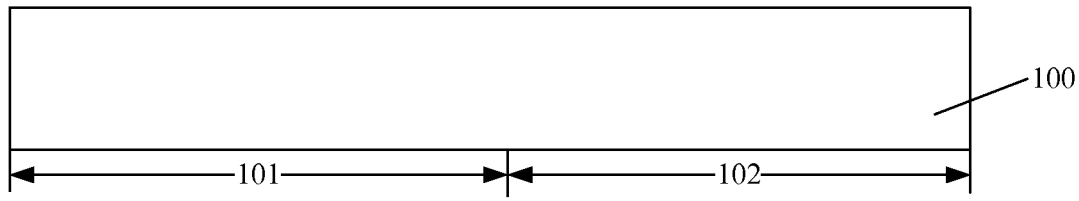
FIGS. 6-16 depict an exemplary semiconductor device at various stages during formation consistent with various disclosed embodiments.

Referring to FIG. 6, a semiconductor substrate 100 is provided. The semiconductor substrate 100 includes a first region 101 and a second region 102 (e.g., in Step 1906 of FIG. 19).

The semiconductor substrate 100 can be silicon or silicon on insulator (SOI). Alternatively, the semiconductor substrate 100 can be made of germanium, silicon germanium, gallium arsenide, and/or germanium-on-insulator. In an exemplary embodiment, the semiconductor substrate 100 is silicon.

The first region 101 can be used for the logic region. Logic transistors can be subsequently formed on the first region 101. The second region 102 can be used for the storage region. Storage units may be subsequently formed on the second region 102. An isolation structure (not shown) may be formed between the first region 101 and the second region 102.

In other embodiments, a high-voltage region may be formed between the first region 101 and the second region 102 for forming high-voltage transistors. The high-voltage transistors may be formed simultaneously when forming the storage unit(s) on the second region 102.

Figure 7:
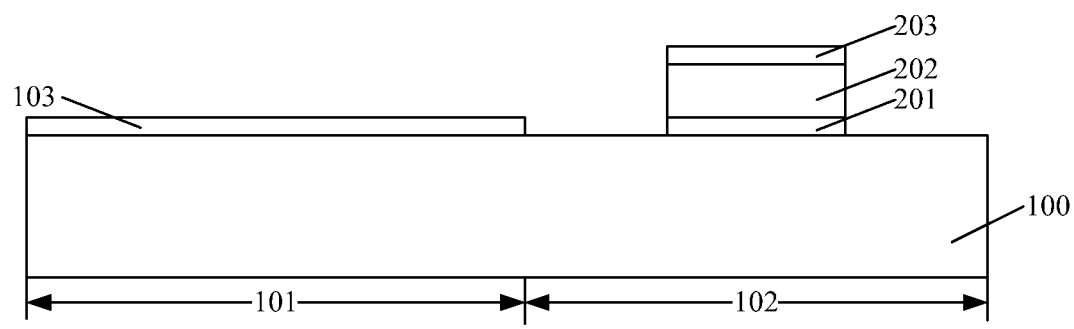

Referring to FIG. 7, a gate dielectric material layer 103 is formed on the first region 101. A floating gate dielectric layer 201 is formed on a surface portion of the second region 102. A floating gate 202 is formed on the floating gate dielectric 201. A control gate dielectric layer 203 is formed on the floating gate 202 (e.g., in Step 1907 of FIG. 19).

The gate dielectric material layer 103 can be made of a material including silicon oxide. The gate dielectric material layer 103 can have a thickness ranging from about 10 Å to about 200 Å. The gate dielectric material layer 103 can be subsequently etched to form a gate dielectric layer 103 of the logic transistor on the first region 101. In other embodiments, the gate dielectric material layer 103 may be a silicon oxynitride.

The floating gate dielectric layer 201 can be made of a material including silicon oxide. The floating gate dielectric layer 201 can have a thickness ranging from about 10 Å to about 200 Å. The floating gate 202 can be made of a material including polysilicon. The floating gate 202 can have a thickness ranging from about 200 Å to about 1000 Å. The control gate dielectric layer 203 can be a multi-layered structure, such as three-layered structure including ONO (silicon oxide-silicon nitride-silicon oxide). In other embodiments, the control gate dielectric layer 203 may have a single layer of silicon oxide or nitrogen silicon. The control gate dielectric layer 203 can have a thickness ranging from about 20 Å to about 200 Å.

In other embodiments, a number of the stacked structures, each including the floating gate dielectric layer 201, the floating gate 202, and control gate dielectric layer 203, can be formed on the second region 102.

In other embodiments, a plurality of selection transistors may be formed on surface of the second region 102. The selection transistors may be formed simultaneously when forming the storage unit(s) on the second region 102. A gate of the selection transistors may have a top surface flushed with the top surface of the control gate of the storage unit.

For illustration purposes, the present disclosure is primarily described as forming a single logic transistor on the first region 101 and forming a single storage unit on the second region 102, although any number of logic transistors and storage units may be formed on a same semiconductor substrate without limitation.

Figure 8:
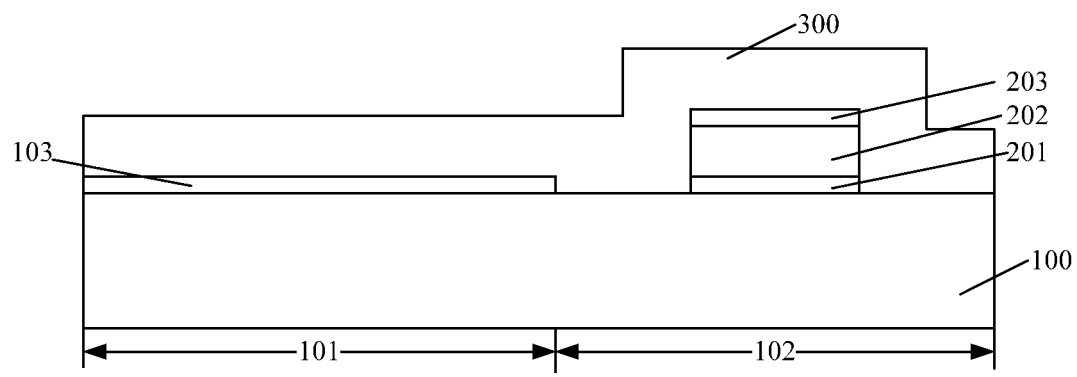

Referring to FIG. 8, a gate material layer 300 is formed on the semiconductor substrate 300. The gate material layer 300 further covers the gate dielectric material layer 103, sidewalls of the floating gate dielectric layer 201 and the floating gate 202, and a top surface of the control gate dielectric layer 203 (e.g., in Step 1908 of FIG. 19).

The gate material layer 300 may be made of polysilicon, and/or may be formed using a chemical vapor deposition process. The gate material layer 300 may have a thickness ranging from about 200 Å to about 2000 Å. The gate material layer 300 may be subsequently etched to form a gate of a logic transistor on the first region 101 and to form a gate of a selection transistor on the second region 102, and/or to form a control gate of the storage unit on the second region 102. In other embodiments, the gate material layer 300 may be formed of Ti, TiN, Ta, and/or other suitable materials.

Because the floating gate 202 and control gate dielectric layer 203 are formed in the second region 102, the control gate dielectric layer 203 can have a top surface higher than the top surface of the gate dielectric layer 103. In this manner, after the gate material layer 300 is formed, the gate material layer 300 in the first region 101 has a top surface portion lower than a top surface portion on the control gate dielectric layer 203 in the second region 102. In other words, the gate material layer 300 can be conformally formed on the entire surface of the semiconductor structure shown in FIG. 7.

Figure 9:
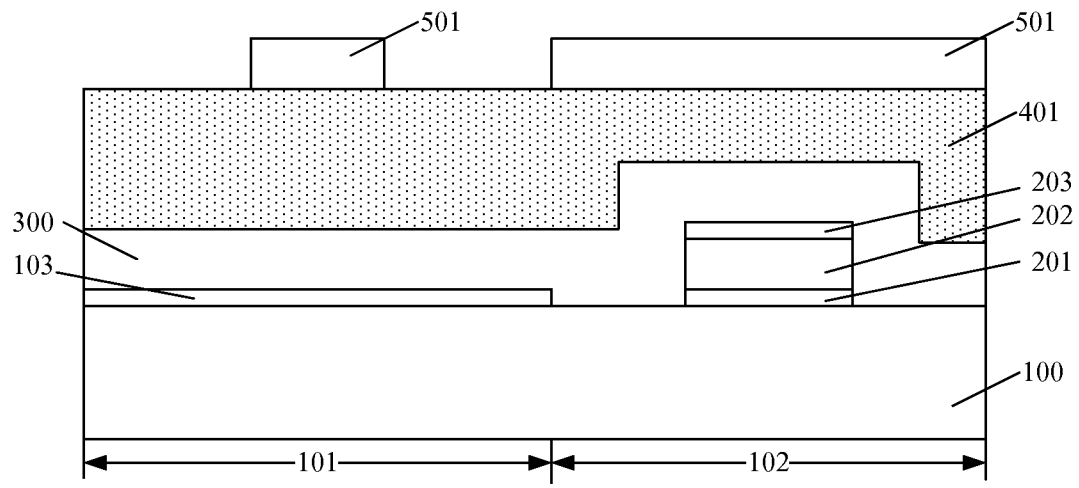

Referring to FIG. 9, a first filling material layer 401 is formed on the gate material layer 300 to provide a first flat surface. A first patterned mask layer 501 is formed on the flat surface of the first filling material layer 401 (e.g., in Step 1909 of FIG. 19).

The first filling material layer 401 is made of an organic material including, for example, a bottom anti-reflective material, a top anti-emission material, etc. In one embodiment, the first filling material layer 401 can be a bottom anti-reflective material. The first filling material layer 401 can be formed using a spin-coating process and/or can have a top surface flushed with the top surface of the BARC layer on the first region 101 and the second region 102, such that the first patterned mask layer 501 can be formed on the first filling material layer 401.

The first patterned mask layer 501 can be made of photoresist material. The first patterned mask layer 501 can cover the second region 102 to protect the gate material layer 300 on the second region 102 from being etching. The first patterned mask layer 501 can further cover a portion of the first region 101 to define a position and size (e.g., to pattern) of gate structure of the subsequently-formed transistor formed on the first region 101. In other embodiments, the first patterned mask layer 501 can be made of silicon nitride, silicon oxide, and/or any suitable materials.

Compared with conventional methods, prior to forming the first filling material layer 401, the disclosed method does not firstly form the control gate on the second region and grooves are not formed on the second region 102. When using spin-coating process to form the first filling material layer 401, the first filling material is only coated on surface of the gate material but not in any grooves formed in the second region 102, because no grooves are formed. The thickness of the first filling material layer 401 on top of the gate material layer 300 on the control gate dielectric layer of the second region 102 can therefore be increased. When subsequently etching the gate structure of the first region 101, the first filling material layer 401 and the first patterned mask layer 501 on the gate material layer 300 of the second region 102 can have a total thickness sufficiently thick to provide sufficient protection for the gate material layer 300 in the second region 102.

Figure 10:
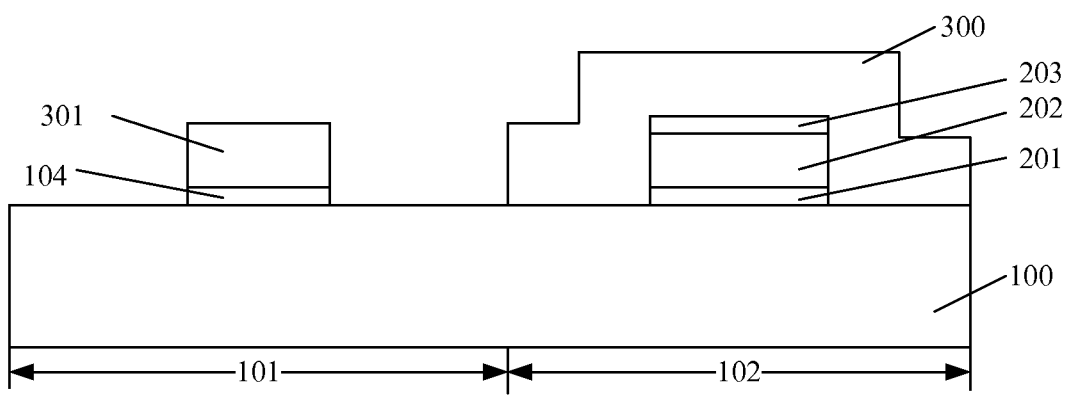

Referring to FIG. 10, the first patterned mask layer 501 is used as an etch mask to etch the first filling material layer 401, the gate material layer 300, and the gate dielectric material layer 103 on the first region 101 to form a gate dielectric layer 104 and a gate 301 located on surface of the gate dielectric layer 104 (e.g., in Step 1910 of FIG. 19). The first patterned mask layer 501 and the first filling material layer 401 can then be removed.

During the etching process, the first patterned mask layer 501 and the first filling material layer 401 can also be etched. Since no grooves are formed in the second region 102, the first filling material layer is not shared by conventional grooves and is all located on the surface of the gate material layer 300 in the second region. As compared with conventional methods, the first filling material layer 401 and the first patterned mask layer 501 on top of the gate material layer 300 on the second region 102 can have an increased thickness, which is sufficiently thick to protect the surface of the gate material layer 300 in the second region 102 from being damaged during the etching process.

The etching process can use the surface of the semiconductor substrate 100 as an etch stop layer to form the gate dielectric layer 104 and the gate 301 on the gate dielectric layer 104 in the first region 101.

After forming the gate dielectric layer 104 and the gate 301 on the dielectric layer 104, an ashing or wet etching process can be used to remove the remainings of the first filling material layer 401 and the first patterned mask layer 501.

In other embodiments, the surface of the gate 301 can be oxidized to form a gate oxide layer. The gate oxide layer can have a thickness ranging from about 5 Å to about 25 Å. In other embodiments, the gate oxide layer can be formed using a wet or dry oxidation process. The gate oxide layer can be used to protect the gate 301 in subsequent processes.

In other embodiments, multiple gates and underlying gate dielectric layer can be formed in the first region 101. The gate can have a gate dimension from about 55 nm to about 65 nm. Accordingly, a distance or pitch between adjacent gates can be from about 125 nm to about 115 nm. In one embodiment, the gate dimension can be about 60 nm, and the distance or pitch between adjacent gates can be about 120 nm.

Figure 11:
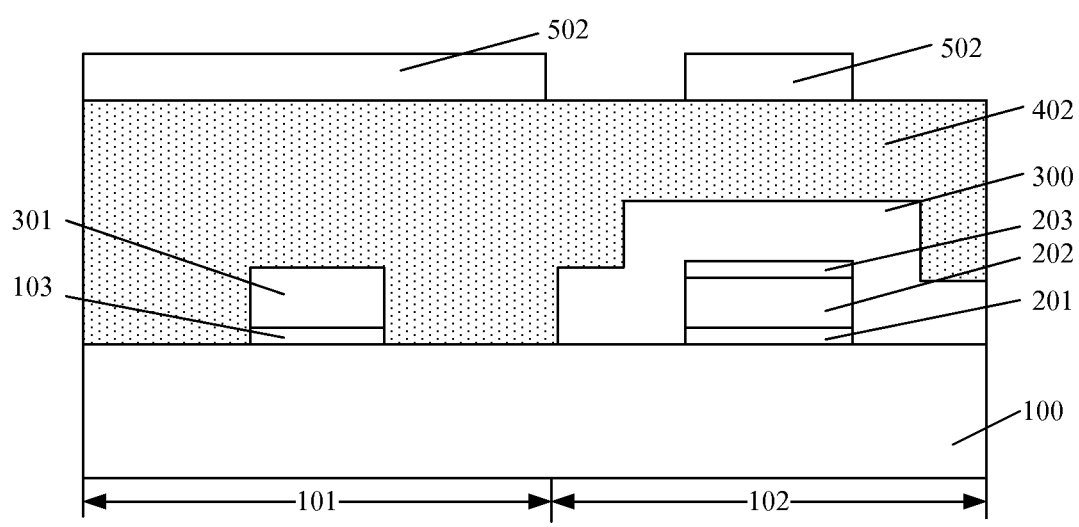

Referring to FIG. 11, a second filling material layer 402 having a second flat surface is formed on surface of the semiconductor substrate 100, and a second patterned mask layer 502 is formed on the second flat surface of the second filling material layer 402 (e.g., in Step 1911 of FIG. 19).

The second filling material layer 402 can cover the first region 101 and the second region 102. The second filling material layer 402 can include an organic material. The organic material may include a bottom anti-reflective material, a top anti-emission material, etc. In one embodiment, the second filling material layer 402 is a bottom anti-reflective material layer. A spin-coating process can be used to form the second filling material layer 402 such that the second filling material layer 402 has a flushed surface between the first region 101 and the second region 102 in order to form the second patterned mask layer 502 on the first filling material layer 401.

The second patterned mask layer 502 can be made of a photoresist material. The second patterned mask layer 502 can be formed to cover the first region 101 and to cover a portion of the second region 102 to define a position and size of (or to pattern) the control gate subsequently formed on the control gate dielectric layer 203 in the second region 102. Alternatively, the second patterned mask layer 502 may be made of a material including silicon oxide or silicon nitride.

Since the gate 301 in the first region 101 has a top surface lower than the gate material layer 300 in the second region 102, the second filling material layer 402 and the second patterned mask layer 502 on the top of the gate electrode 301 can have a total thickness greater than a total thickness of the second filling material layer 402 and the second patterned mask layer 502 on the gate material layer 300 in the second region 102. This can protect the gate electrode 301 when etching to form the control gate in the second region 102.

Figure 12:
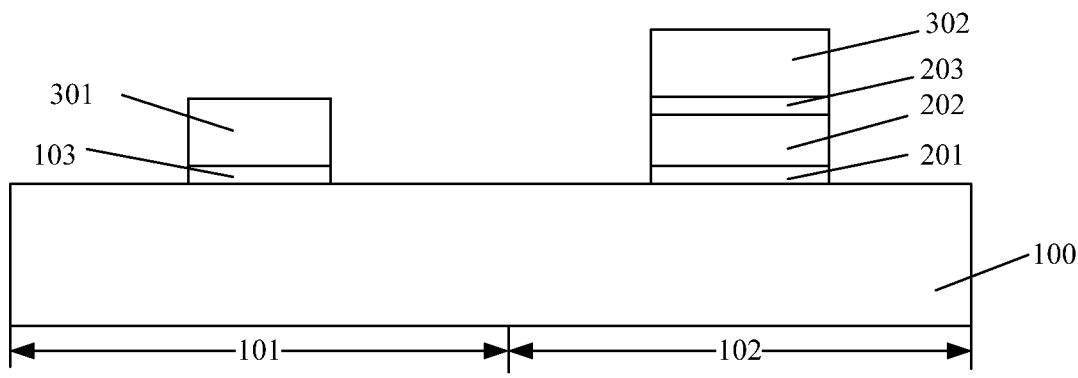

Referring to FIG. 12, the second patterned mask layer 502 is used as an etch mask to etch the second filling material layer 402 and the gate material layer 300 on the second region 102 to form the control gate 203 located on surface of the dielectric layer control gate 302 (e.g., in Step 1912 of FIG. 19). The second patterned mask layer 502 and the remaining second filling material layer 402 can then be removed. In an exemplary embodiment, the control gate 302 is formed on the control gate dielectric layer in the second region 102 by together etching the gate material layer 300, the control gate dielectric layer 203, the floating gate 202, and the floating gate dielectric layer 201 in the second region 102 using the second patterned mask layer 502 as an etch mask.

When etching the second filling material layer 402 and the gate material layer 300 in the second region 102, damages may be simultaneously caused to the second filling material layer 402 and the second patterned mask layer 502 in the first region 101. However, due to a low height of the gate 301 in the first region 101, the second filling material layer 402 and the second patterned mask layer 502 on the gate 301 can have a total thickness sufficiently high to protect the surface of the gate 301.

After the gate material layer 300 is etched to form the control gate 302 using the semiconductor substrate 100 as a stop layer, the remaining of the second filling material layer 402 and the second patterned mask layer 502 can be removed, e.g., using an ashing or a wet etching process.

In other embodiments, the control gate 302 can be optionally surface-oxidized to form a control gate oxide layer. The control gate oxide layer can have a thickness ranging from about 5 Å to about 40 Å. The control gate oxide layer can also be formed by a wet or dry oxidation process. The control gate oxide layer can be used to protect the control gate 302 in subsequent processes.

Figure 13:
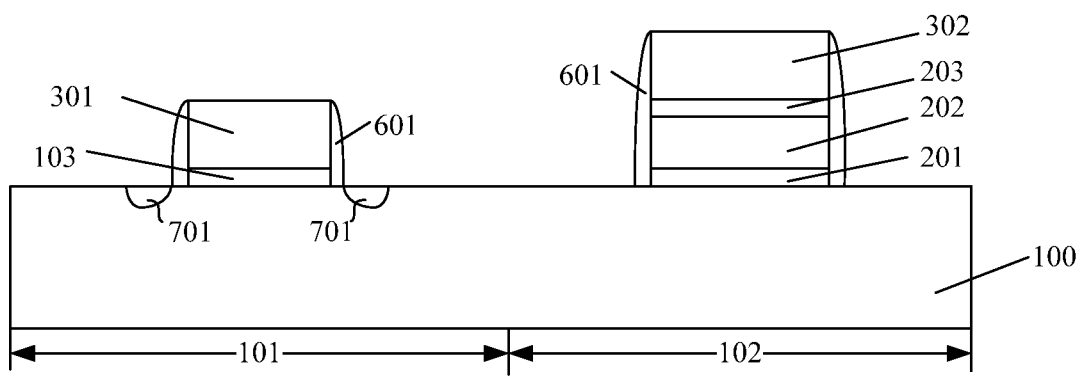

Referring to FIG. 13, a first spacer 601 can be formed on both sidewalls of the gate dielectric layer 103 and the gate 301 in the first region 101, and on both sidewalls of the floating gate dielectric layer 201, the floating gate 202, the control gate dielectric layer 203, and the control gate 302 in the second region 102. A first lightly doped region 701 on both sides of the gate 301 in the first region 101 is formed using the gate 301 and first spacer 601 as a mask to perform a first lightly doped ion implantation (e.g., in Step 1913 of FIG. 19).

The first spacer 601 can be made of silicon nitride and can have a thickness ranging from about 10 Å to about 100 Å. The first spacer 601 can be used to protect the gate 301 and gate dielectric layer 103 in the following first lightly doped ion implantation. The first spacer 601 can be formed simultaneously in the first region 101 and the second region 102.

The first lightly doped region 701 can have a conductive type the same as that for the logic transistor formed in the first region 101. For example, when the logic transistor is an NMOS, the first lightly doped region 701 can be doped with N-type ions including P, As, Sb, or a combination thereof. The first lightly doped ion implantation can use implantation energy of about 3 KeV to about 30 KeV with a doping concentration of about 1E3 atom/cm$^3$ to about 9E4 atom/cm$^3$.

In another example, when the transistor is a PMOS, the first lightly doped ion implantation can use P-type ions including B, Ga, In, or a combination thereof. The first lightly doped ion implantation can use implantation energy of about 3 KeV to about 30 KeV with a doping concentration of about 1E3 atom/cm$^3$ to about 9E4 atom/cm$^3$. In other embodiments, parameters for the lightly doped ion implantation can be first adjusted according to actual needs and then the lightly doped ion implantation can be performed.

The first spacer 601 can have a thickness to define a distance between the first lightly doped region 701 and a channel region under the gate 301. By adjusting the thickness of the first spacer 601, the distance between the first lightly doped region 701 and the channel region under the gate 301 can be adjusted and also the distance between the first lightly doped region 701 and the gate 301 can be adjusted.

Figure 14:
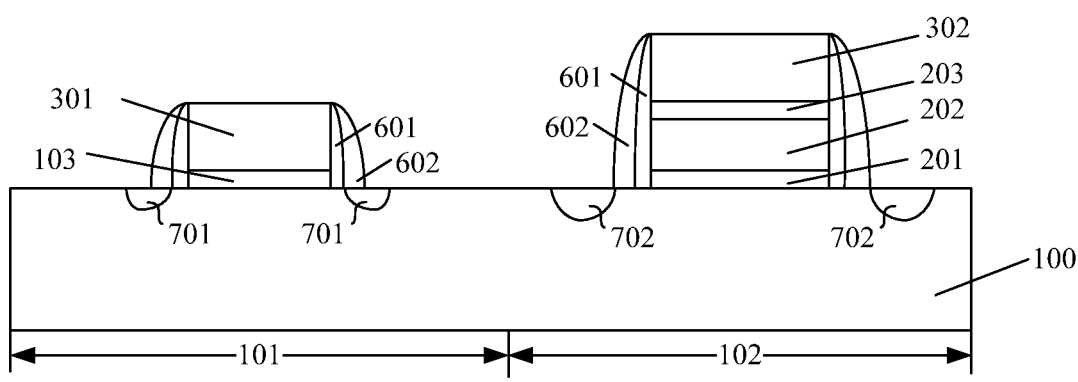

Referring to FIG. 14, a second spacer 602 is formed on the first spacer 601 in both the first and second regions. A second lightly doped region 702 is formed in the second region 102 of the semiconductor substrate 100 on both sidewalls of the spacer 602 by a second lightly doped ion implantation using the control gate 302, the first spacer 601, and the second spacer 602 as a mask (e.g., in Step 1914 of FIG. 19).

The second spacer 602 can be made of a material of silicon oxide. The second spacer 602 can have a thickness ranging from about 20 Å to about 150 Å. The second spacer 602 can be formed simultaneously in the first region 101 and the second region 102.

In one embodiment, the second lightly doped ion implantation can be performed to dope P-type ions with implantation energy of about 3 KeV to about 30 KeV and an ion concentration of about 1E3 atom/cm$^3$ to about 9E9 atom/cm$^3$. In other embodiments, the second lightly doped ion implantation can implant a second type of ions such as N-type ions.

The storage unit such as a flash memory unit formed in the second region 102 has an operating voltage greater than an operating voltage of the logic transistor formed in the first region 101. This requires a distance between the second lightly doped region 702 and a channel region under the control gate 302 of the subsequently formed flash memory unit is greater than a distance between the first lightly doped region and the channel region under the gate 301 in the first region 101.

For at least this reason, the second light doped region 702 in the second region 102 are formed after forming the second spacer 602 on the first spacer 601, so that the distance between the second lightly doped region 702 and the channel region under the control gate 302 is sufficiently far away to thereby improve the breakdown voltage between the second lightly doped regions 702 and the control gate 302. The distance between the second lightly doped regions 702 and the channel region under control the gate 302 can be controlled by adjusting the total thickness of the first spacer 601 and the second spacer 602.

Figure 15:
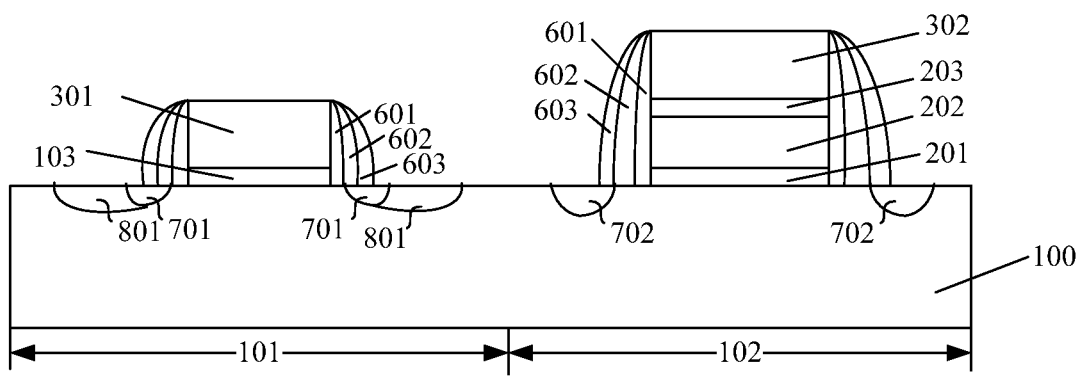

Referring to FIG. 15, a third spacer 603 is formed on the second spacer 602. A first heavily doped ion implantation can be performed on both sides of the third spacer 603 in the first region 101 to form a first source/drain region 801 (e.g., in Step 1915 of FIG. 19).

The third sidewall 603 is made of a material including silicon nitride. The third sidewall 603 can have a thickness of about 200 Å to about 700 Å. The third spacer 603 can be formed simultaneously on the first region 101 and the second region 102.

The first heavily doped ion implantation can have an ion type the same as that for the logic transistors in the first region 101. A total thickness of the third spacer 603, the second spacer 602, and the first spacer 601 can be adjusted to adjust a distance between the first source/drain region 801 and the channel region under the gate 301.

Figure 16:
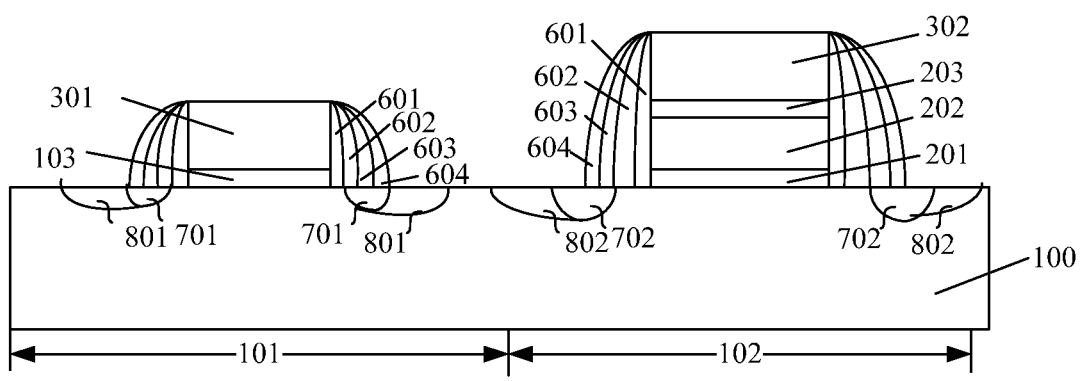

Referring to FIG. 16, a fourth spacer 604 is formed on the third spacer 603. A second heavily doped ion implantation can be performed on both sides of the fourth sidewall 604 in the second region 102 to form a second source/drain 802 (e.g., in Step 1916 of FIG. 19).

The fourth spacer 604 can be made of a material including silicon oxide. The fourth spacer 604 can have thickness of about 200 Å to about 700 Å. The fourth spacer 604 can be formed simultaneously on the first region 101 and the second region 102.

The second heavily doped ion implantation can include same ion type as for the second lightly doped ion implantation. In one embodiment, the second heavily doped ion implantation can include P-type ions.

A distance between the second source/drain region 802 formed by the second heavily doped ion implantation and the channel region under the control gate 302 in the second region 102 of the semiconductor substrate 100 can be determined by a total thickness of the fourth spacer 604, the third spacer 603, the second spacer 602, and the first spacer 601. Because the total thickness of the fourth spacer 604, the third spacer 603, the second spacer 602, and the first spacer 601 on the second region 102 is greater than the total thickness of the third spacer 603, the second spacer 602, and the first spacer 601 on the first region 101 for the first heavily doped ion implantation, a distance between the second source/drain region 802 and the channel region in the second region 102 is greater than a distance between the first source/drain region 801 and the channel region in the first region 101. The breakdown voltage between the control gate 302 and the second source/drain region 802 can be improved.

Figure 17:
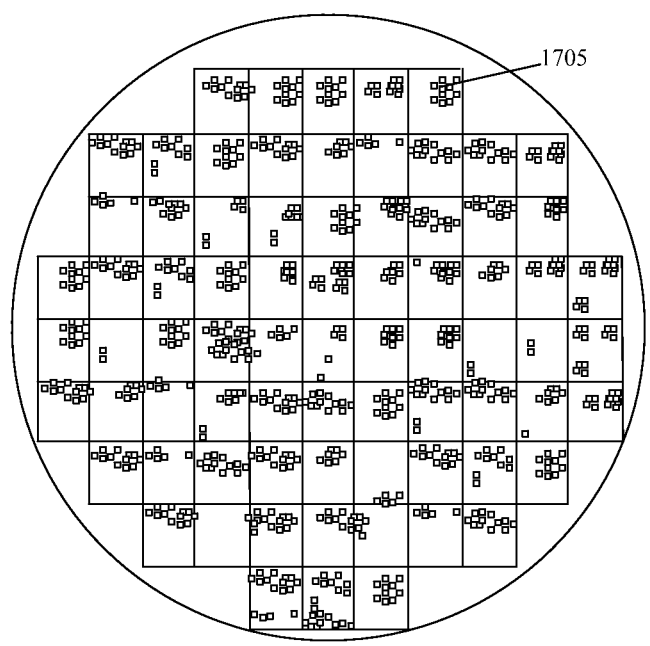
FIG. 17 depicts a defect detection of a conventional semiconductor structure.

FIG. 17 depicts a defect detection of a wafer surface having a conventionally formed semiconductor structure including a flash memory device. A large amount of defects 1705 are shown on surface of a control gate.

Figure 18:
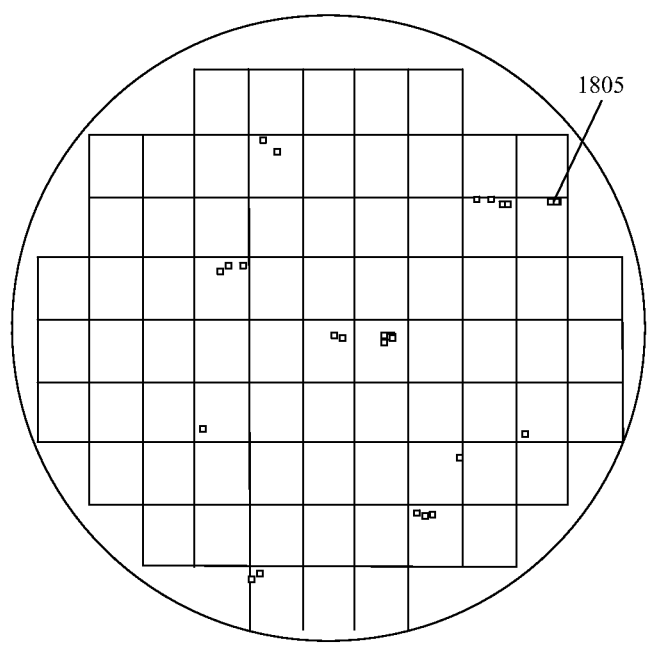
FIG. 18 depicts a defect detection of an exemplary semiconductor structure consistent with various disclosed embodiments.

FIG. 18 depicts a defect detection of a wafer surface having the disclosed semiconductor structure including a flash memory device. Compared with the conventionally formed semiconductor structure in FIG. 17, the number of defects 1805 on the control gate of the disclosed semiconductor structure is significantly reduced. Performance of the formed storage unit is significantly improved.

Other applications, advantages, alternations, modifications, or equivalents to the disclosed embodiments are obvious to those skilled in the art.

What is claimed is:

1. A method for forming a semiconductor device, comprising:
    providing a semiconductor substrate including a first region and a second region;
    forming a gate dielectric material layer to cover the first region of the semiconductor substrate, and forming a floating gate dielectric layer on a surface portion of the second region of the semiconductor substrate, a floating gate on the floating gate dielectric layer, and a control gate dielectric layer on the floating gate, wherein the control gate dielectric layer has a top surface higher than the gate dielectric material layer in the first region;
    conformally forming a gate material layer to cover the gate dielectric material layer of the first region and to cover the semiconductor substrate, sidewalls of the floating gate dielectric layer and the floating gate and the control gate dielectric layer, a top surface of the control gate dielectric layer of the second region, the gate material layer on the control gate dielectric layer of the second region having a top surface higher than a top surface in the first region;
    forming a first filling material layer on the gate material layer to provide a first flat surface and forming a first patterned mask layer on the first filling material layer to cover the second region and to perform a patterning in the first region;
    forming a gate on a gate dielectric layer in the first region by etching the gate material layer and the gate dielectric material layer using the first patterned mask layer as an etch mask, wherein the gate material layer in the second region has the top surface higher than a top surface of the gate of the first region; and
    forming a control gate on the control gate dielectric layer in the second region by etching the gate material layer in the second region.

2. The method according to claim 1, further including:
    after forming the gate of the first region, oxidizing a surface of the gate to form a gate oxide layer.

3. The method according to claim 2, wherein the gate oxide layer has a thickness ranging from about 5 Å to about 25 Å.

4. The method according to claim 1, further including:
after forming the control gate of the second region, oxidizing a surface of the control gate to form a control gate oxide layer.

5. The method according to claim 4, wherein the control gate oxide layer has a thickness ranging from about 5 Å to about 40 Å.

6. The method according to claim 1, wherein, after forming the gate of the first region, the control gate is formed including:
removing the first patterned mask layer and the first filling material layer;
forming a second filling material layer to fill an entire surface in the first region and the second region to provide a second flat surface, and forming a second patterned mask layer on the second filling material layer to cover the first region and to perform a patterning in the second region; and
forming the control gate on the control gate dielectric layer in the second region by together etching the gate material layer, the control gate dielectric layer, the floating gate, and the floating gate dielectric layer in the second region using the second patterned mask layer as an etch mask.

7. The method according to claim 1, further including:
forming a first spacer on sidewalls of the gate and the gate dielectric layer in the first region, and on sidewalls of the control gate, the control gate dielectric layer, the floating gate, and the floating gate dielectric layer in the second region;
forming a second spacer on the first spacer on each of the first region and the second region;
forming a third spacer on the second spacer on each of the first region and the second region; and
forming a fourth spacer on the third spacer on each of the first region and the second region.

8. The method according to claim 7, wherein the first spacer is made of a material including silicon nitride and the first spacer has a thickness ranging from about 10 Å to about 100 Å.

9. The method according to claim 7, wherein the second spacer is made of a material including silicon oxide and the second spacer has a thickness ranging from about 20 Å to about 150 Å.

10. The method according to claim 7, wherein the third spacer is made of a material including silicon nitride and the third spacer has a thickness ranging from about 200 Å to about 700 Å.

11. The method according to claim 7, wherein the fourth spacer is made of a material including silicon oxide and the fourth spacer has a thickness ranging from about 200 Å to about 700 Å.

12. The method according to claim 7, further including:
forming a first lightly doped region on both sides of the gate in the first region by a first lightly doped ion implantation using the first spacer and the gate as a mask,
forming a second lightly doped region on both sides of the control gate in the second region by a second lightly doped ion implantation using the second spacer, the first spacer, and the control gate as a mask,
forming a first source/drain region by forming a first heavily doped region on both sides of the gate in the first region by a first heavily doped ion implantation using the third spacer, the second spacer, the first spacer, and the gate as a mask, and
forming a second source/drain region by forming a second heavily doped region on both sides of the control gate in the second region by a second heavily doped ion implantation using the fourth spacer, the third spacer, the second spacer, the first spacer, and the control gate as a mask.

13. The method according to claim 12, wherein the first lightly doped ion implantation includes N-type ions selected from including P, As, Sb, or a combination thereof, an implantation energy ranging from about 3 KeV to about 30 KeV, and an ion concentration ranging from about 1E3 atom/cm$^3$ to about 9E4 atom/cm$^3$.

14. The method according to claim 12, wherein the second lightly doped ion implantation includes P-type ions selected from including B, Ga, In, or a combination thereof, an implantation energy ranging from about 3 KeV to about 30 KeV, and an ion concentration ranging from about 1E3 atom/cm$^3$ to about 9E4 atom/cm$^3$.

15. The method according to claim 1, wherein the gate material layer includes a material of polysilicon.

* * * * *